(12) United States Patent
Wang et al.

(10) Patent No.: US 9,734,382 B2
(45) Date of Patent: Aug. 15, 2017

(54) FINGERPRINT SENSOR HAVING ESD PROTECTION

(71) Applicant: ELAN MICROELECTRONICS CORPORATION, Hsinchu (TW)

(72) Inventors: Chun-Chi Wang, Puli Township, Nantou County (TW); Tsung-Yin Chiang, Xingang Township, Chiayi County (TW); Chao-Chi Yang, Hsinchu (TW)

(73) Assignee: ELAN MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 14/935,137

(22) Filed: Nov. 6, 2015

(65) Prior Publication Data
US 2016/0171275 A1 Jun. 16, 2016

Related U.S. Application Data

(60) Provisional application No. 62/090,364, filed on Dec. 11, 2014, provisional application No. 62/092,225, (Continued)

(30) Foreign Application Priority Data

Jul. 30, 2015 (TW) .............................. 104124650 A

(51) Int. Cl.
*G06K 9/00* (2006.01)
*H01L 27/02* (2006.01)
(Continued)

(52) U.S. Cl.
CPC ....... *G06K 9/00053* (2013.01); *G06K 9/0002* (2013.01); *G06K 9/00006* (2013.01);
(Continued)

(58) Field of Classification Search
CPC ............. G06K 9/0002; G06K 9/00053; G06K 9/00006; H01L 27/0248; G01D 5/24; G01R 27/2605; H03K 17/955
(Continued)

(56) References Cited

U.S. PATENT DOCUMENTS 6,346,739 B1 * 2/2002 Lepert ................ G06K 9/00053
257/532
6,628,812 B1 * 9/2003 Setlak ................... G06F 1/1616
382/124

(Continued)

FOREIGN PATENT DOCUMENTS

TW 200406712 A 5/2004
TW 201237772 A 9/2012

*Primary Examiner* — Kanjibhai Patel
(74) *Attorney, Agent, or Firm* — patenttm.us

(57) ABSTRACT

A fingerprint sensor having ESD protection has a body and an ESD protection circuit. The body has a fingerprint sensing electrode array and an ESD protection electrode providing an ESD protection to the fingerprint sensing electrode array. The ESD protection circuit is connected respectively to the ESD protection electrode, a high electric potential terminal and a low electric potential terminal. The ESD protection circuit provides a first static electricity discharge path to the high electric potential terminal, and a second static electricity discharge path to the low electric potential terminal. The fingerprint sensor provides two static electricity discharge paths, so that the fingerprint sensor has a better ESD protection.

26 Claims, 17 Drawing Sheets

Related U.S. Application Data filed on Dec. 15, 2014, provisional application No. 62/096,894, filed on Dec. 26, 2014, provisional application No. 62/116,885, filed on Feb. 16, 2015.

(51) Int. Cl.
    *G01D 5/24*     (2006.01)
    *G01R 27/26*     (2006.01)
    *H03K 17/955*     (2006.01)

(52) U.S. Cl.
    CPC .......... *H01L 27/0248* (2013.01); *G01D 5/24* (2013.01); *G01R 27/2605* (2013.01); *H03K 17/955* (2013.01)

(58) Field of Classification Search
    USPC ........................................................ 382/124
    See application file for complete search history.

(56) References Cited

U.S. PATENT DOCUMENTS

| | | | |
|---|---|---|---|
| 6,686,546 B2 | 2/2004 | Chiu | |
| 7,076,089 B2 * | 7/2006 | Brandt | G06K 9/00053 382/124 |
| 7,208,961 B2 * | 4/2007 | Miyasaka | G06K 9/0002 324/658 |
| 8,598,667 B2 * | 12/2013 | Moriwaki | H01L 27/0255 257/355 |
| 8,716,613 B2 * | 5/2014 | Perezselsky | G06K 9/00053 178/18.03 |
| 9,342,194 B2 * | 5/2016 | Schneider | G06F 3/044 |

* cited by examiner

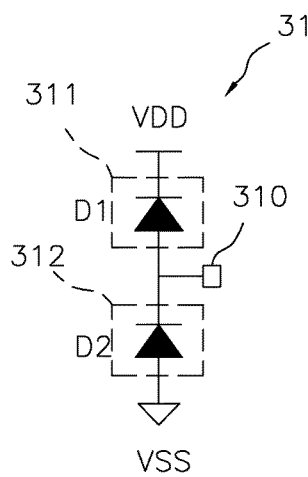
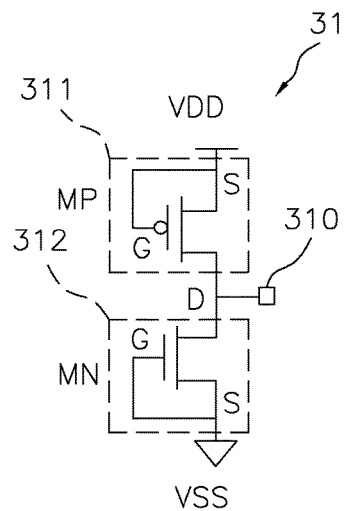
FIG. 3A          FIG. 3B
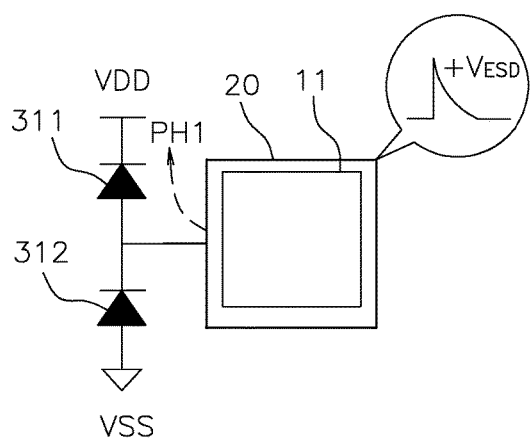
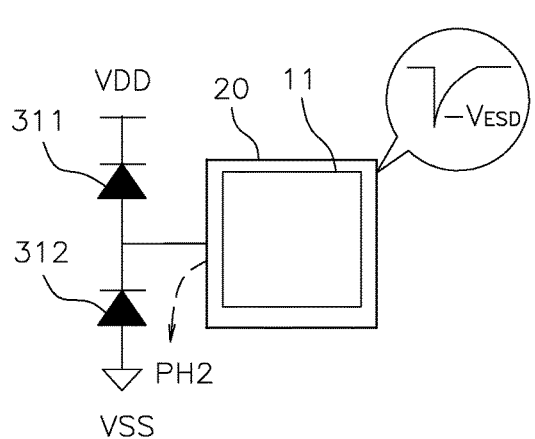
FIG. 4A          FIG. 4B

FINGERPRINT SENSOR HAVING ESD PROTECTION

CROSS-REFERENCE TO RELATED APPLICATIONS

This application claims the benefit of United States provisional application filed on Dec. 11, 2014 and having application Ser. No. 62/090,364, the entire contents of which are hereby incorporated herein by reference.

This application claims the benefit of United States provisional application filed on Dec. 15, 2014 and having application Ser. No. 62/092,225, the entire contents of which are hereby incorporated herein by reference.

This application claims the benefit of United States provisional application filed on Dec. 26, 2014 and having application Ser. No. 62/096,894, the entire contents of which are hereby incorporated herein by reference.

This application claims the benefit of United States provisional application filed on Feb. 16, 2015 and having application Ser. No. 62/116,885, the entire contents of which are hereby incorporated herein by reference.

This application is based upon and claims priority under 35 U.S.C. 119 from Taiwan Patent Application No. 104124650 filed on Jul. 30, 2015, which is hereby specifically incorporated herein by this reference thereto.

BACKGROUND OF THE INVENTION

1. Field of the Invention

The present invention relates to a fingerprint sensor, especially to a fingerprint sensor with Electrostatic Discharge (ESD) protection.

2. Description of the Prior Arts

With reference to FIG. 12, a conventional fingerprint sensor 50 has multiple sensing electrodes 51. To keep the sensing electrodes 51 from being damaged, an ESD protection electrode 60 is formed around the sensing electrodes 51 and is connected to a ground GND so that the static electricity charge is discharged to the ground GND.

Since the ESD protection electrode 60 is only connected to the ground GND, the positive and negative static electricity charges may not be discharged completely, and the sensing electrodes 51 and other electronic components may be damaged accordingly.

To overcome the shortcomings, the present invention provides a fingerprint sensor with ESD protection to mitigate or obviate the aforementioned problems.

SUMMARY OF THE INVENTION

To achieve the objective, the present invention provides a fingerprint sensor having ESD protection providing multiple discharging paths for the static electricity charges to discharge the positive and negative static electricity charges.

The fingerprint sensor having ESD protection comprises:

a body having a fingerprint sensing electrode array and an ESD protection electrode providing an ESD protection for the fingerprint sensing electrode array; and an ESD protection circuit connected to the ESD protection electrode, a high electric potential terminal and a low electric potential terminal, wherein the ESD protection circuit provides a first static electricity discharge path to the high electric potential terminal and a second static electricity discharge path to the low electric potential terminal.

The ESD protection circuit provides the first static electricity discharge path to the high electric potential terminal and the second static electricity discharge path to the low electric potential terminal. Therefore, the positive and negative static electricity charges of the ESD protection electrode are rapidly discharged through the first and second static electricity discharge paths to keep the fingerprint sensing array and the interior circuit from damaging.

Other objectives, advantages and novel features of the invention will become more apparent from the following detailed description when taken in conjunction with the accompanying drawings.

BRIEF DESCRIPTION OF THE DRAWINGS

FIG. 3A is a circuit diagram of a first embodiment of an ESD circuit for the fingerprint sensor in FIG. 1;

FIG. 3B is a circuit diagram of a second embodiment of an ESD circuit for the fingerprint sensor in FIG. 1;

FIG. 4A is an illustrative view of a first static electricity discharge path provided by the ESD circuit in FIG. 3A;

FIG. 4B is an illustrative view of a second static electricity discharge path provided by the ESD circuit in FIG. 3A;

DETAILED DESCRIPTION OF THE PREFERRED EMBODIMENTS

Figure 1:
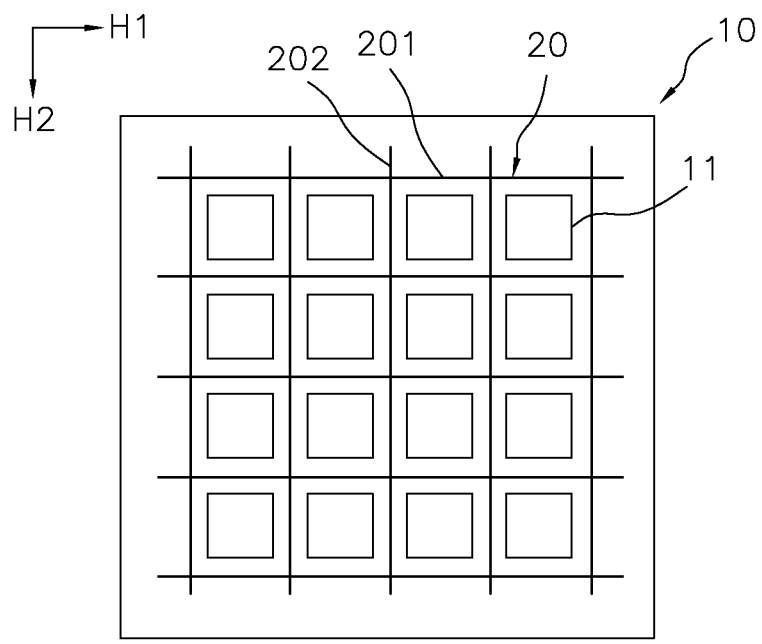
FIG. 1 is a top view of a first embodiment of a fingerprint sensor in accordance with the present invention.
Figure 2:
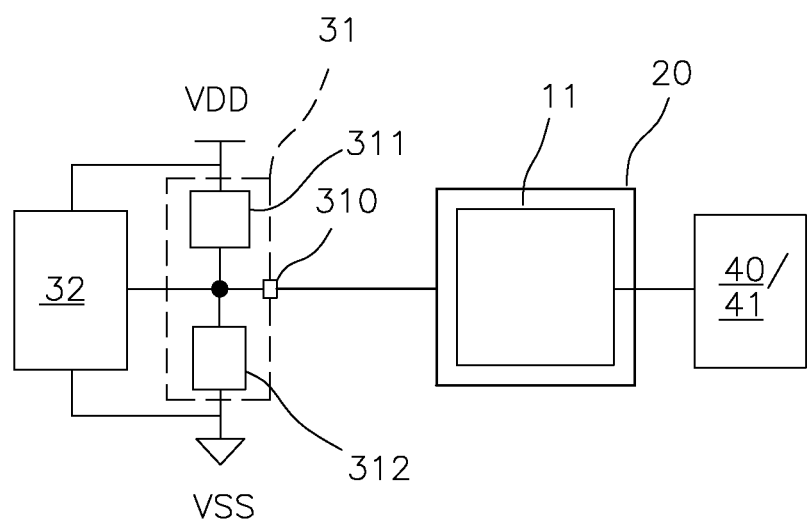
FIG. 2 is a partial circuit diagram of the fingerprint sensor in FIG. 1.

With reference to FIGS. 1 and 2, a first embodiment of a fingerprint sensor with ESD protection in accordance with the present invention has a body 10 and an ESD protection circuit 31.

The body 10 has a fingerprint sensing electrode array and an ESD protection electrode 20. The fingerprint sensing electrode array has m*n sensing electrodes 11 arranged in m columns and n rows. The n rows are parallel to a first axis H1 and the m columns are parallel to a second axis H2. The ESD protection electrode 20 provides ESD protection to the fingerprint sensing electrode array.

With reference to FIG. 2, the ESD protection circuit 31 is connected to the ESD electrode 20, a high electric potential terminal VDD and a low electric potential terminal VSS (or ground) to provide a first static electricity discharge path to the high electric potential terminal VDD and to provide a second static electricity discharge path to the low electric potential terminal VSS. In this embodiment, the ESD protection circuit 31 has a connecting end 310, a first discharging unit 311 and a second discharging unit 312. The connecting end 310 is connected to the ESD protection electrode 20. The first discharging unit 311 is coupled between the high electric potential terminal VDD and the connecting end 310. The second discharging unit 312 is coupled between the low electric potential terminal VSS and the connecting end 310.

With reference to FIGS. 3A and 3B, in one embodiment, the first discharging unit 311 may be a diode D1 with an anode and a cathode. The anode of the diode D1 is coupled to the connecting end 310, and the cathode of the diode D1 is coupled to the high electric potential terminal VDD. In another embodiment, the first discharging unit 311 may be a P-type Metal-Oxide-Semiconductor Field-Effect Transistor (PMOSFET) MP with a drain D, a gate G and a source G. The drain D of the PMOSFET MP is coupled to the connecting end 310. The gate G of the PMOSFET MP is connected to the source S of the PMOSFET MP. The source S of the PMOSFET MP is coupled to the high electric potential terminal VDD.

In one embodiment, the second discharging unit 312 may be a diode D2 with a cathode and an anode. The cathode of the diode D2 is coupled to the connecting end 310, and the anode of the diode D2 is coupled to the low electric potential terminal VSS. In another embodiment, the second discharging unit 312 may be a N-type Metal-Oxide-Semiconductor Field-Effect Transistor (NMOSFET) MN with a drain D, a gate G and a source G. The drain D of the NMOSFET MN is coupled to the connecting end 310. The gate G of the NMOSFET MN is connected to the source S of the NMOSFET MN. The source S of the NMOSFET MN is coupled to the low electric potential terminal VSS.

In another embodiment, the first and second discharging unit may be Silicon Controlled Rectifiers (SCRs).

With further reference to FIG. 4A, the first discharging unit 311 provides the first static electricity discharge path PH1 to discharge the positive static charge+$V_{ESD}$ to the high electric potential terminal VDD. With further reference to FIG. 4B, the second discharging unit 312 is coupled between the low electric potential terminal VSS and the connecting end 310 and provides the second static electricity discharge path PH2 to discharge the negative static charge –$V_{ESD}$ to the low electric potential terminal VSS.

Figure 5A:
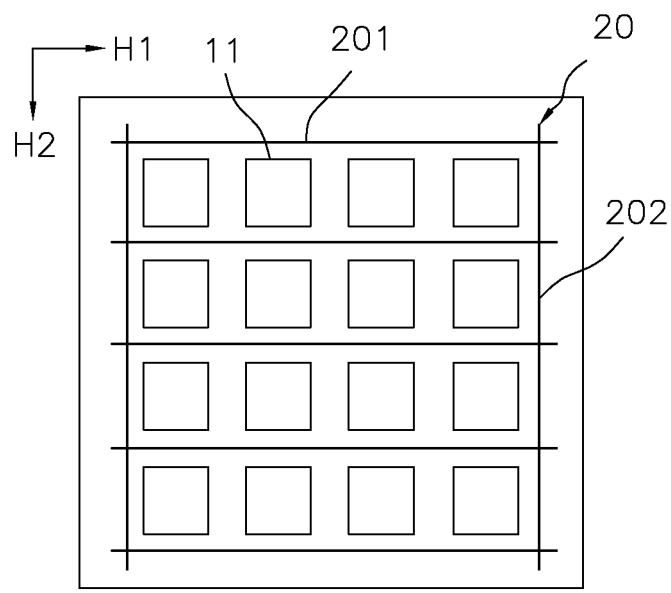
FIG. 5A is a top view of a second embodiment of a fingerprint sensor in accordance with the present invention.
Figure 5B:
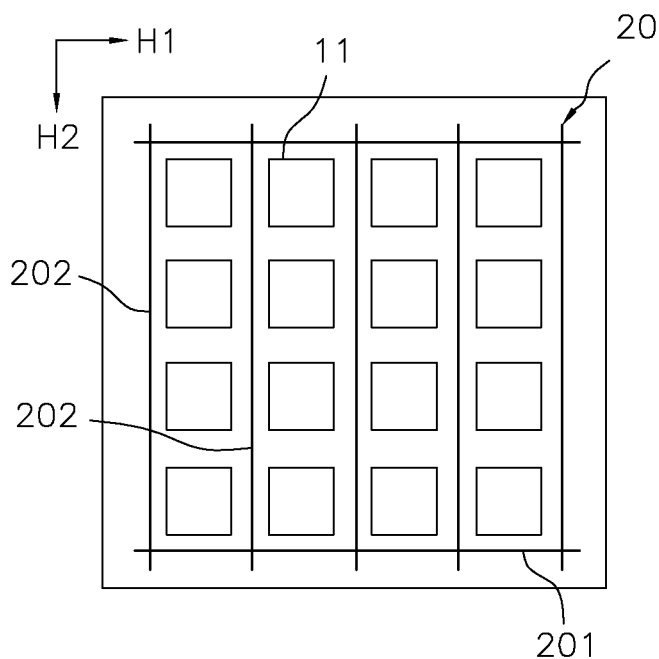
FIG. 5B is a top view of a third embodiment of a fingerprint sensor in accordance with the present invention.

The ESD protection electrode 20 may be arranged in different ways. With reference to FIG. 5A, in one embodiment, the ESD protection electrode 20 may have multiple first conductive lines 201 and two second conductive lines 202. The first conductive lines 201 are parallel to the first axis H1 and are arranged respectively on both sides of each column of the sensing electrodes 11. The second conductive lines 202 are parallel to the second axis H2, are arranged respectively on two outer sides of the sensing electrode array and are electrically connected to the first conductive lines 201. With reference to FIG. 5B, in another embodiment, the ESD protection electrode may have two first conductive lines 201 and multiple second conductive lines 202. The first conductive lines 201 parallel to the first axis H1 and are arranged respectively on two outer sides of the sensing electrode array. The second conductive lines 202 are parallel to the second axis H2, are arranged respectively on both sides of each row of the sensing electrodes 11 and are electrically connected to the first conductive lines 201. In another embodiment as shown in FIG. 1, the ESD protection electrode 20 may have m+1 first conductive lines 201 and n+1 second conductive lines 202. The first conductive lines 201 are parallel to the first axis H1 and are arranged respectively on both sides of each rows of sensing electrode 11. The second conductive lines 202 are parallel to the second axis H2, are arranged respectively on both sides of each column of sensing electrodes 11 and are electrically connected to the first conductive lines 201. Each sensing electrode 11 is surrounded by the ESD protection electrode 20.

Figure 6A:
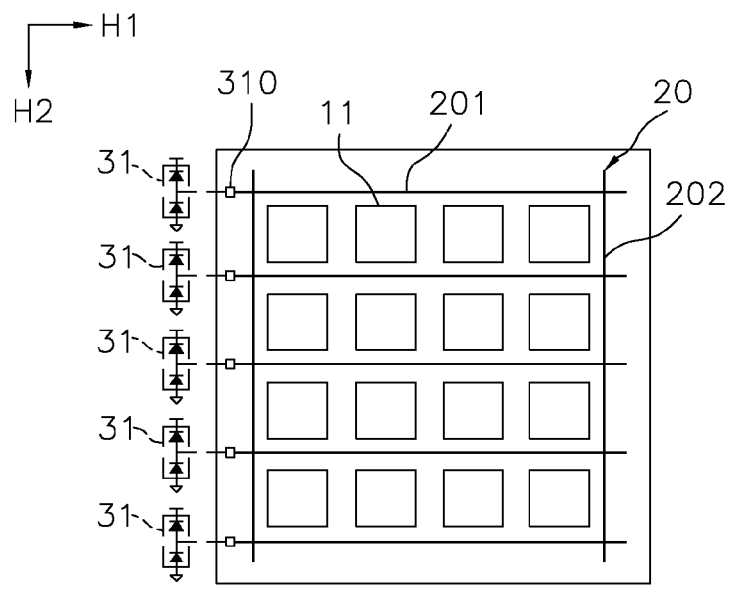
FIG. 6A is an operational view showing that the fingerprint sensor in FIG. 5A connecting to multiple static electricity circuits.
Figure 6B:
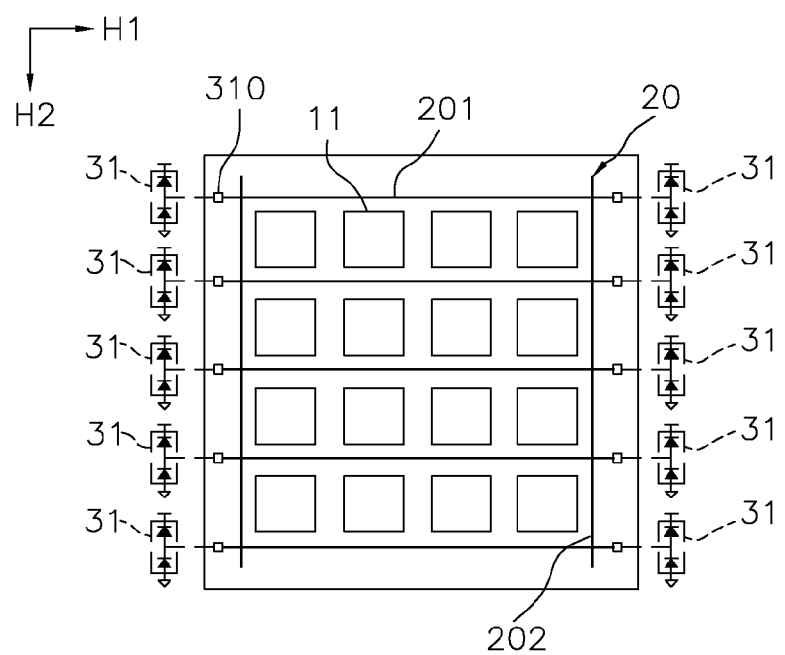
FIG. 6B is another operational view showing that the fingerprint sensor in FIG. 5A connecting to multiple static electricity circuits.

In different embodiments, multiple ESD protection circuits may be arranged to connect to the ESD protection electrode 20 in the aforementioned embodiments. In FIGS. 6A and 6B, two arrangements of ESD protection circuits are respectively connect to the ESD protection electrodes shown in FIG. 5A. With reference to FIG. 6A, in one embodiment, one end of each first conductive line 201 may be connected to one ESD protection circuit 31. With reference FIG. 6B, in one embodiment, each of both ends of each first conductive line 201 may be connected to one ESD protection circuit 31.

Figure 6C:
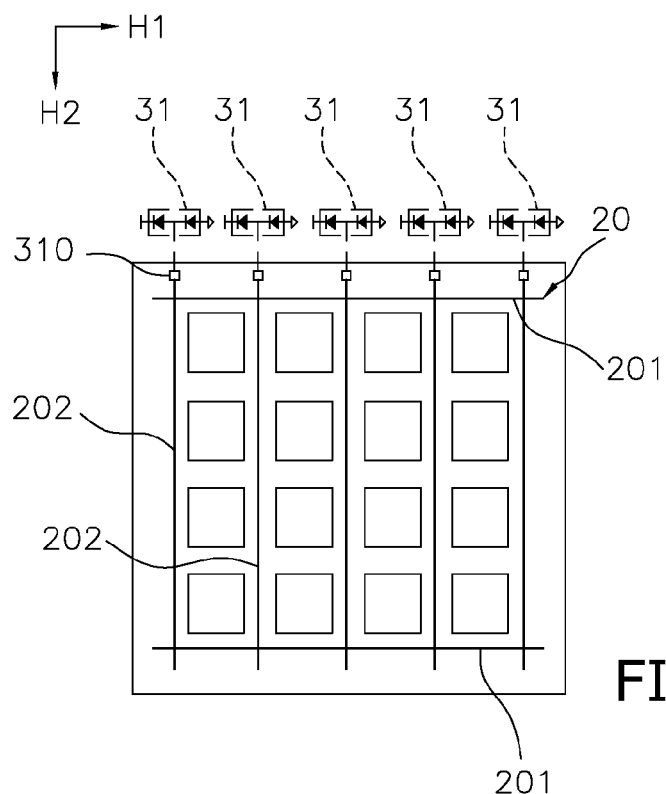
FIG. 6C is an operational view showing that the fingerprint sensor in FIG. 5B connecting to multiple static electricity circuits.
Figure 6D:
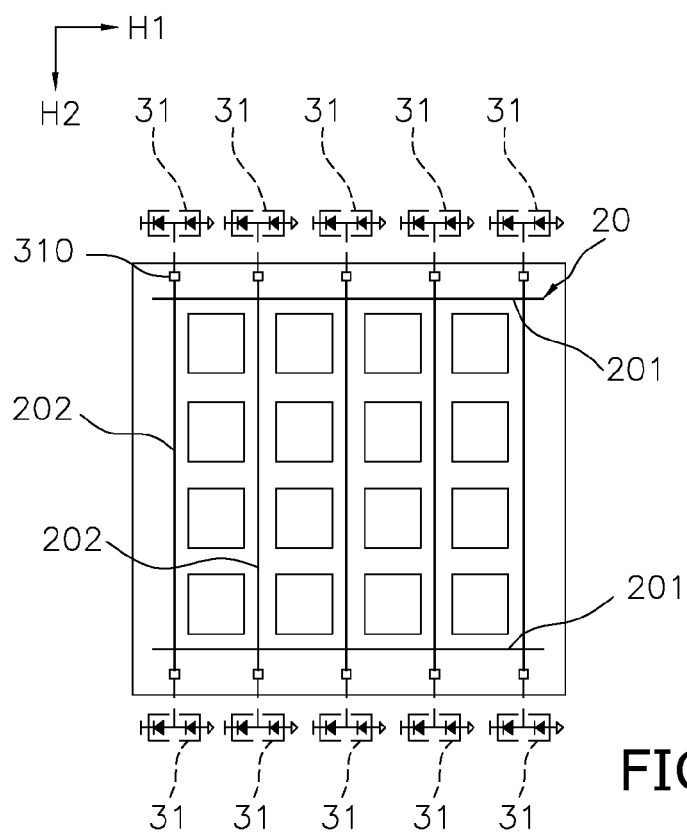
FIG. 6D is another operational view showing that the fingerprint sensor in FIG. 5B connecting to multiple static electricity circuits.

In FIGS. 6C and 6D, two arrangements of ESD protection circuits are respectively connect to the ESD protection electrodes shown in FIG. 5B. With reference to FIG. 6C, in one embodiment, one end of each second conductive line 202 may be connected to one ESD protection circuit 31. With reference to FIG. 6D, in one embodiment, each of both ends of each second conductive line 202 may be connected to one ESD protection circuit 31.

Figure 7A:
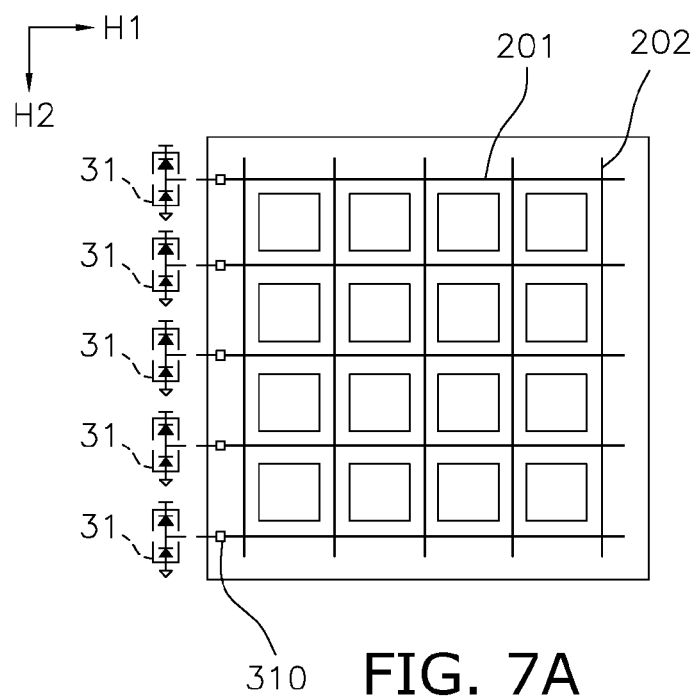
FIGS. 7A to 7J are operational views showing that the fingerprint sensor in FIG. 1 connecting to multiple static electricity circuits.
Figure 7B:
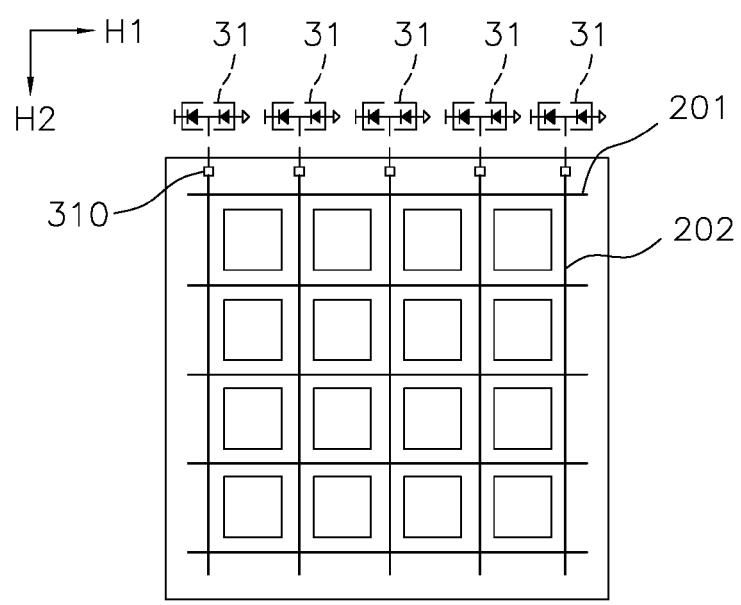

In embodiments shown in FIGS. 7A to 7J, multiple ESD protection circuits are arranged to connect to the ESD protection electrodes shown in FIG. 1. With reference to FIG. 7A, in one embodiment, one end of each first conductive line 201 may be connected to one ESD protection circuit 31. With reference FIG. 7B, in one embodiment, one end of each second conductive line 201 may be connected to one ESD protection circuit 31.

Figure 7C:
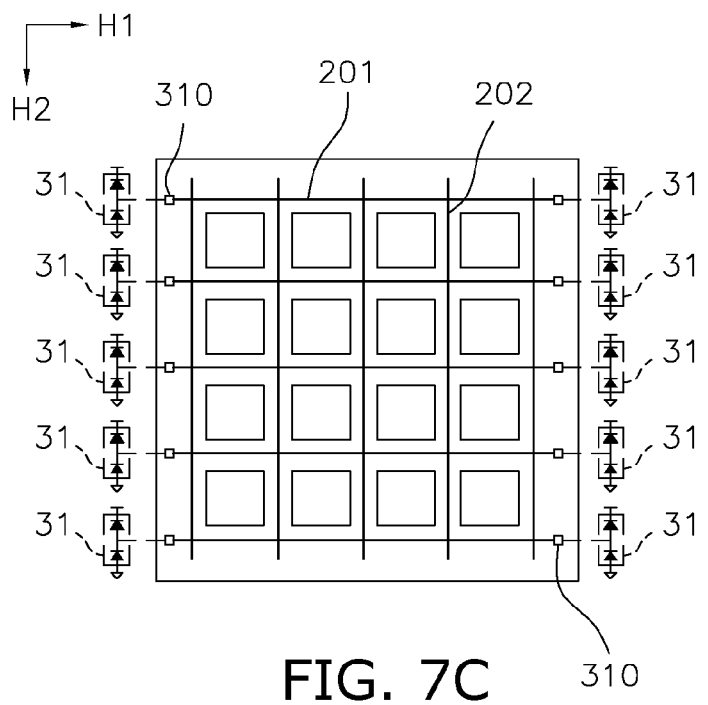
Figure 7D:
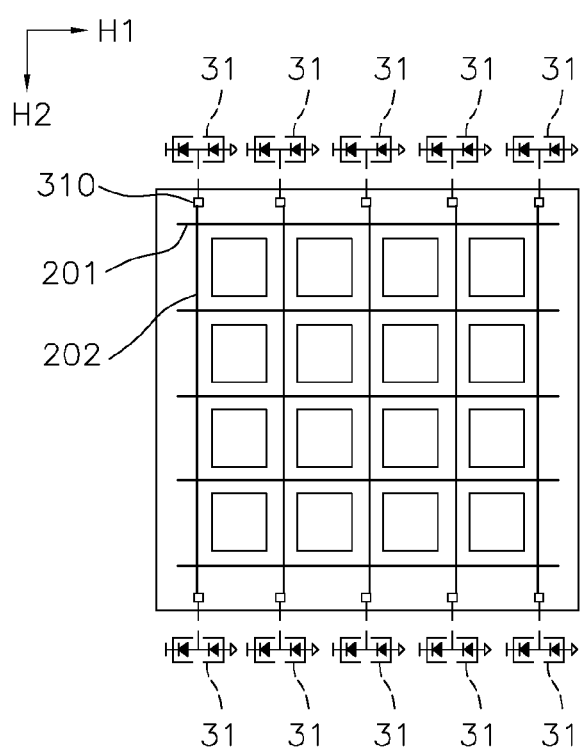

With reference to FIG. 7C, in one embodiment, each of both ends of each first conductive line 201 may be connected to one ESD protection circuit 31. With reference to FIG. 7D, in one embodiment, each of both ends of each second conductive line 202 may be connected to one ESD protection circuit 31.

Figure 7E:
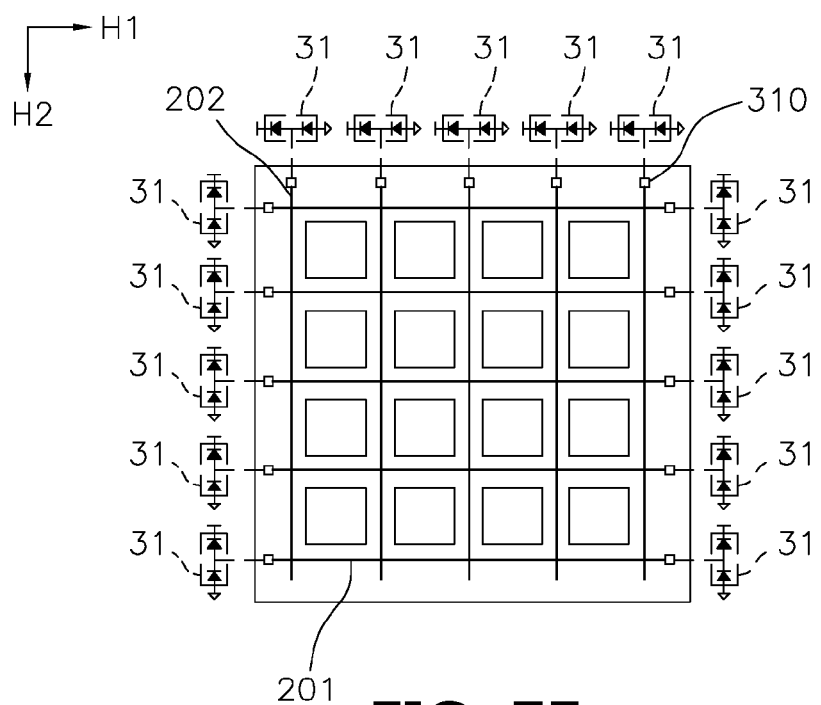
Figure 7F:
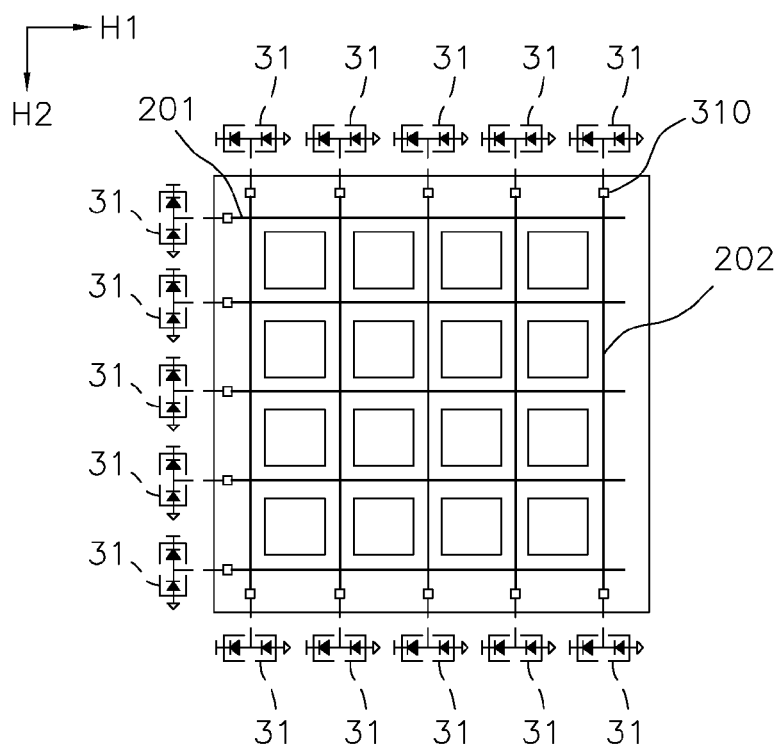

With reference FIG. 7E, in one embodiment, each of both ends of each first conductive line 201 may be connected to one ESD protection circuit 31 and one end of each second conductive line 202 may be connected to one ESD protection circuit 31. With reference FIG. 7F, in one embodiment, one end of each first conductive line 201 may be connected to one ESD protection circuit 31 and each of both ends of each second conductive line 202 may be connected to one ESD protection circuit 31.

Figure 7G:
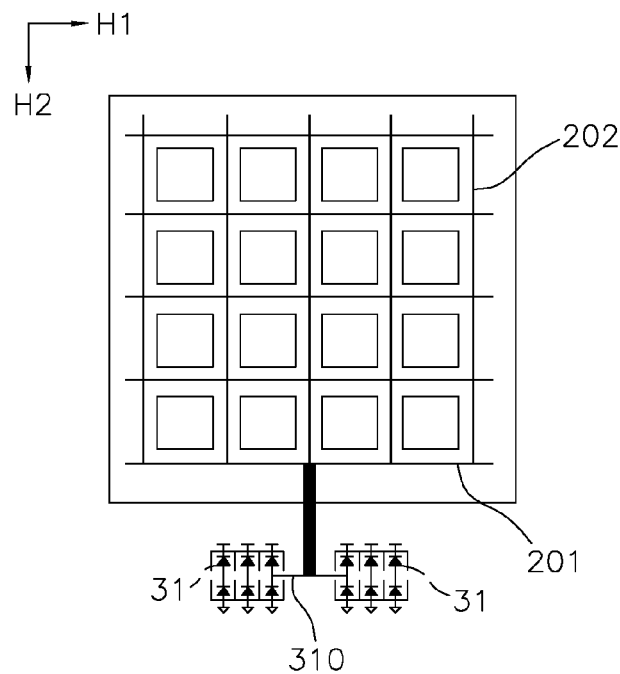
Figure 7H:
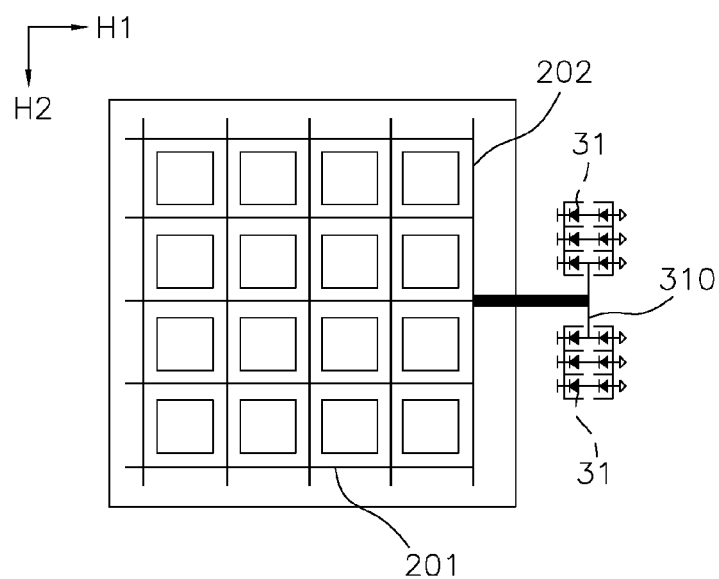

With reference to FIG. 7G, in one embodiment, a middle part of an outermost one of the first conductive lines 201 is connected to multiple protection circuits 31. With reference to FIG. 7H, in one embodiment, a middle part of an outermost one of the second conductive lines 202 is connected to multiple protection circuits 31.

Figure 7I:
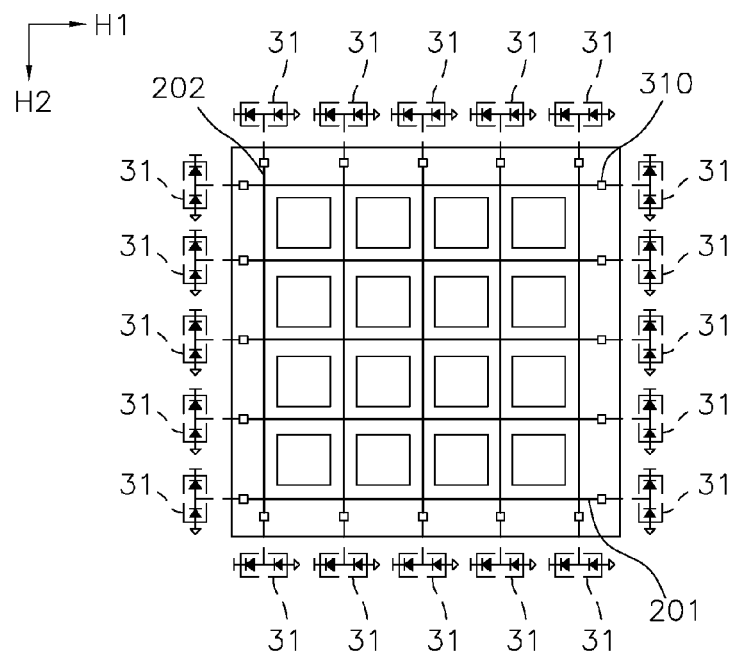

With reference to FIG. 7I, in one embodiment, each of both ends of each first conductive line 201 may be connected to one ESD protection circuit 31 and each of both ends of each second conductive line 202 may be connected to one ESD protection circuit 31.

Figure 7J:
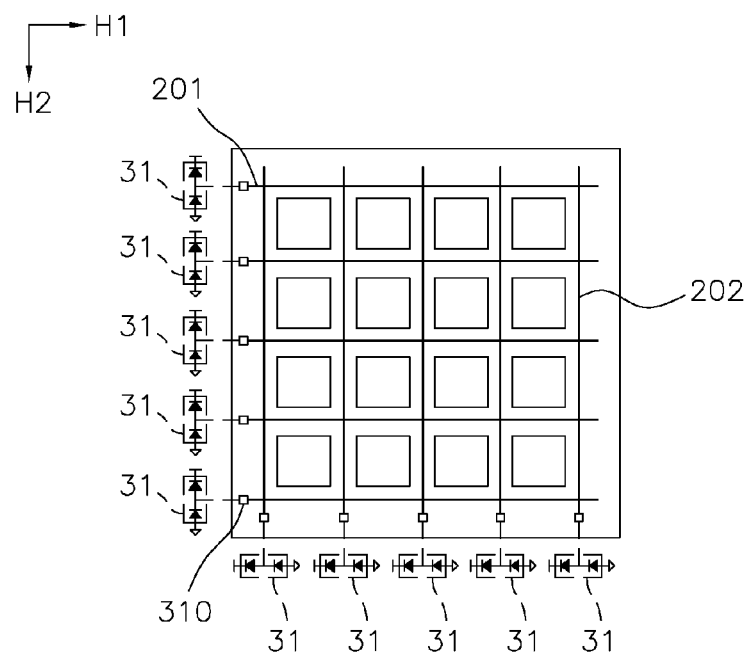

With reference to FIG. 7J, in one embodiment, one end of each first conductive line 201 may be connected to one ESD protection circuit 31 and one end of each second conductive line 202 may be connected to one ESD protection circuit 31.

In the embodiments as shown in FIGS. 6A to 7J, each ESD protection circuit 31 may be connected to the first conductive lines 201 and to the second conductive lines 202 through the connecting end 310.

The sensing electrodes 11 of the fingerprint sensing electrode array and the ESD protection electrode 20 may be located in the same layer or different layers in the semiconductor structure. Different arrangements are shown in FIGS. 8A to 9E.

Figure 8A:
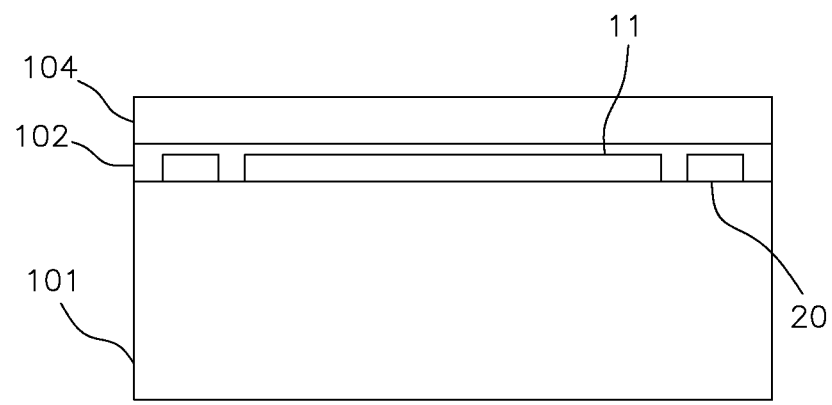
FIGS. 8A to 8E are partially side views in partial section of the semiconductor structure of the fingerprint sensor in accordance with the present invention.

With reference to FIG. 8A, in one embodiment, the sensing electrodes 11 and the ESD protection electrode 20 are formed in the same layer and are formed on a substrate 101. A first dielectric layer 102 is covered on the sensing electrodes 11 and the ESD protection electrode 20. A protecting layer 104 is covered on the first dielectric layer 102.

Figure 8B:
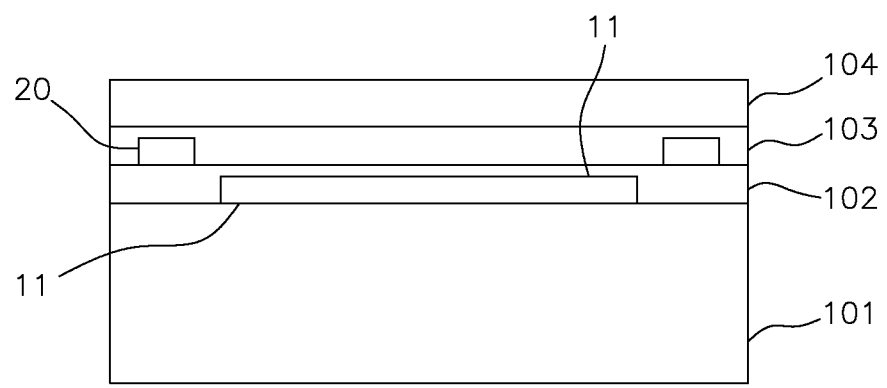

With reference to FIG. 8B, in one embodiment, the sensing electrodes 11 and the ESD protection electrode 20 are formed in different layers and the layer with the ESD protection electrode 20 is formed above the layer with the sensing electrodes 11. The first dielectric layer 102 is covered on the sensing electrodes 11. The ESD protection electrode 20 is formed on an upper surface of the first dielectric layer 102. A second dielectric layer 103 is covered on the ESD protection electrode 20. The protecting layer 104 is covered on the second dielectric layer 103.

Figure 8C:
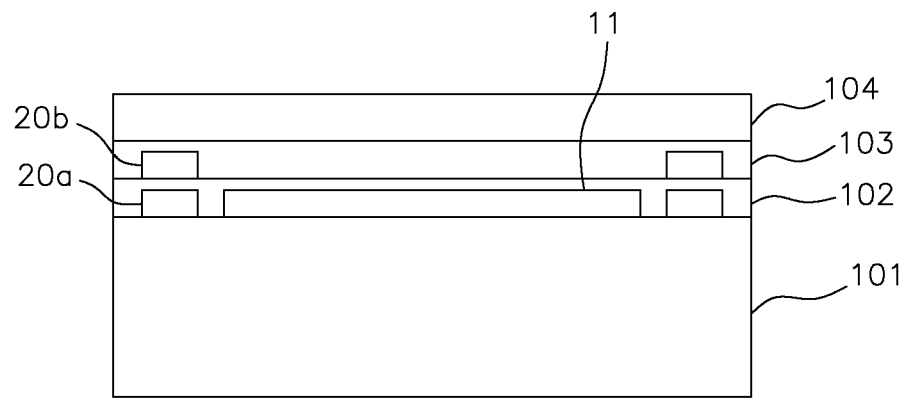

With reference to FIG. 8C, in one embodiment, the sensing electrodes 11 and a first ESD protection electrode 20a are formed in the same layer. The first dielectric layer 102 is covered on the sensing electrodes 11 and the first ESD protection electrode 20a. A second ESD protection electrode 20b is formed on the first dielectric layer 102. The second ESD protection electrode 20b aligns with and is electrically connected to the first ESD protection electrode 20a. The second dielectric layer 103 is covered on the second ESD protection electrode 20b. The protecting layer 104 is covered on the second dielectric layer 103.

Figure 8D:
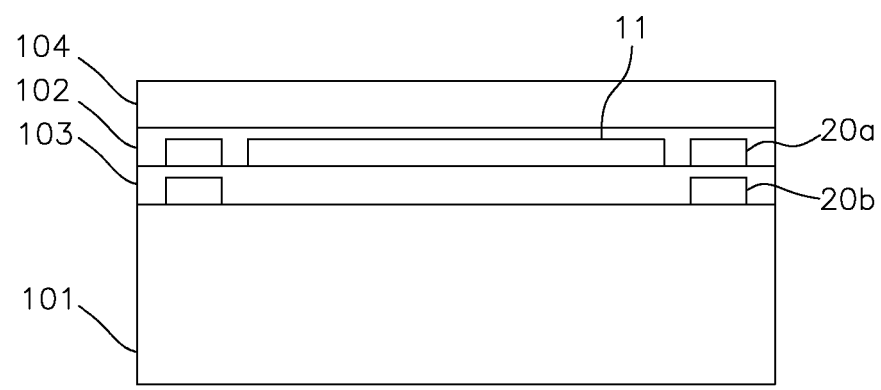

With reference to FIG. 8D, in one embodiment, the sensing electrodes 11 and the first ESD protection electrode 20a are formed in the same layer. The first dielectric layer 102 is covered on the sensing electrodes 11 and the first ESD protection electrode 20a. The second ESD protection electrode 20b is formed under the first ESD protection electrode 20a. The second ESD protection electrode 20b aligns with and is electrically connected to the first ESD protection electrode 20a. The second dielectric layer 103 is covered on the second ESD protection electrode 20b. The protecting layer 104 is covered on the second dielectric layer 102.

Figure 8E:
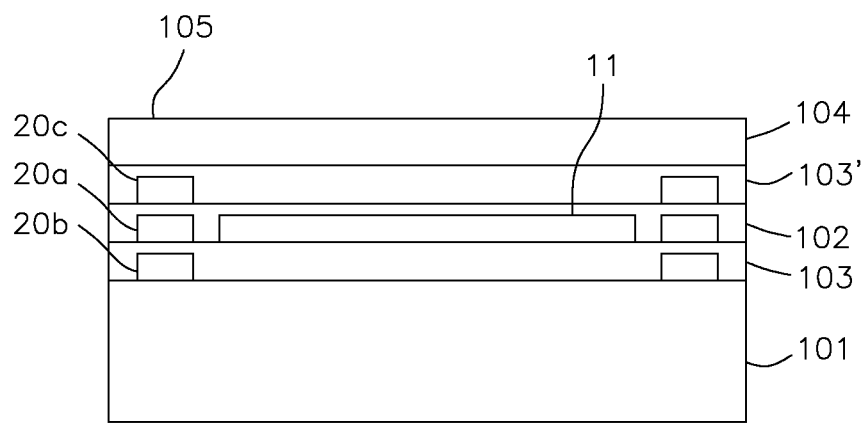
Figure 9A:
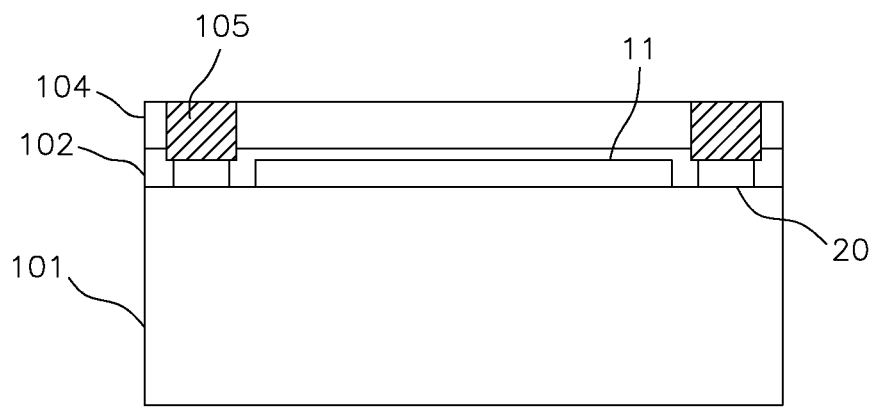
FIGS. 9A to 9E are another partially side views in partial section of the semiconductor structure of the fingerprint sensor in accordance with the present invention.
Figure 9B:
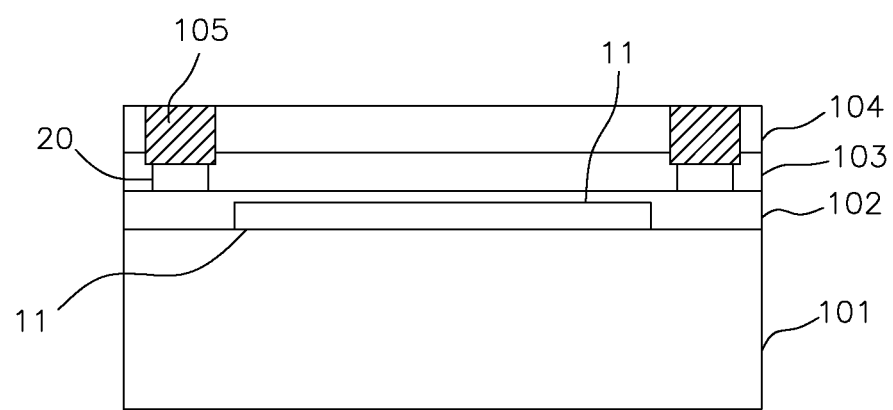
Figure 9C:
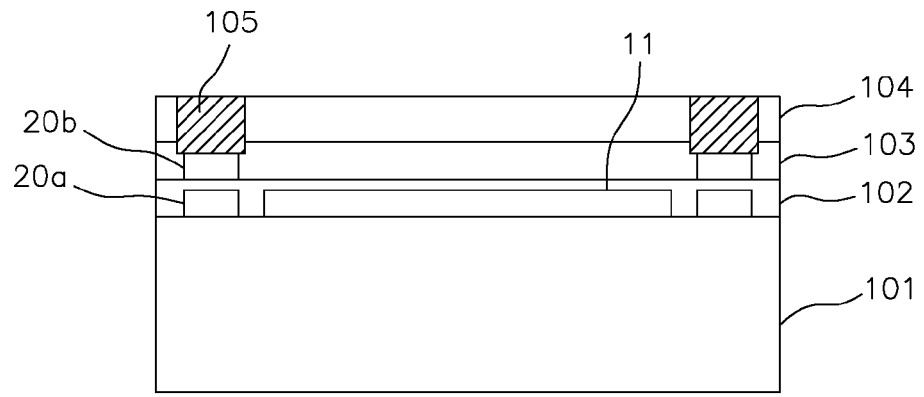
Figure 9D:
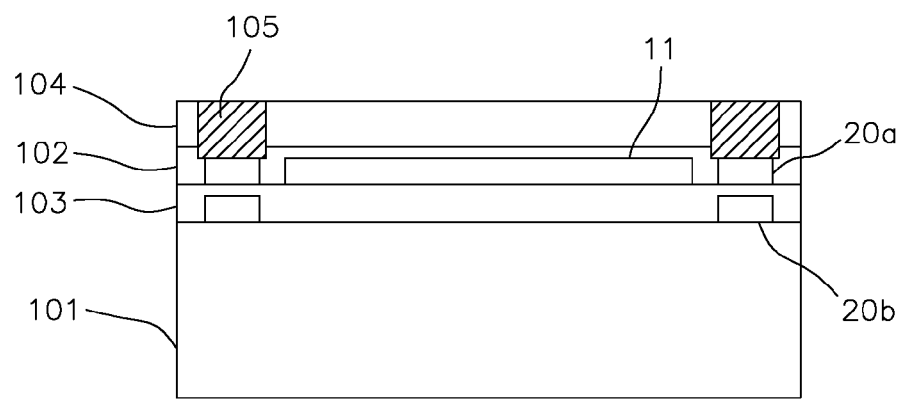
Figure 9E:
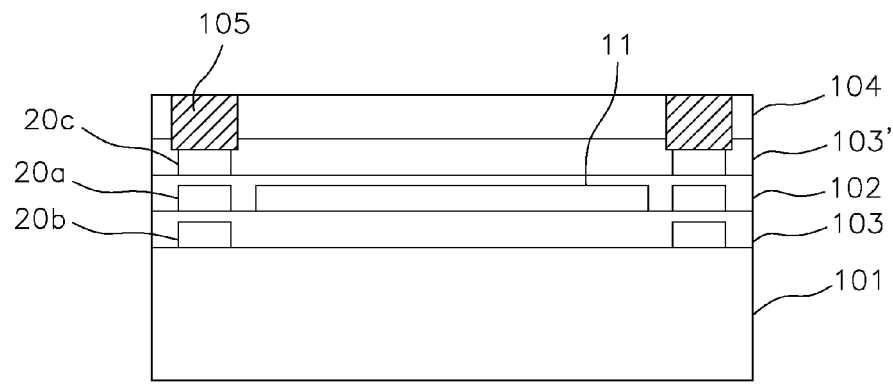

FIG. 8E shows an embodiment modified from the embodiment shown in FIG. 8D, a third ESD protection electrode 20c is formed on the first dielectric layer 102 and is covered by a third dielectric layer 103'. The protecting layer 104 is covered on the second dielectric layer 103'. The third ESD protection electrode 20c aligns with and is electrically connected to the first ESD protection electrode 20a.

FIGS. 9A to 9E, show embodiments modified from the embodiments shown in FIGS. 8A to 8E. In the FIGS. 9A to 9E, multiple ground holes 105 are formed through the protecting layer 104 and may be connected to the uppermost ESD protection electrode of the ESD protection electrode 20, the first ESD protection electrode 20a, the second ESD protection electrode 20b or the third ESD protection electrode 20c.

The reference number 101 shown in FIGS. 8A to 9E represents a substrate. The substrate 101 is used for forming the ESD protection circuit 31, the other electronic components for the fingerprint sensor, and the leading wires for transmitting signals.

Figure 10:
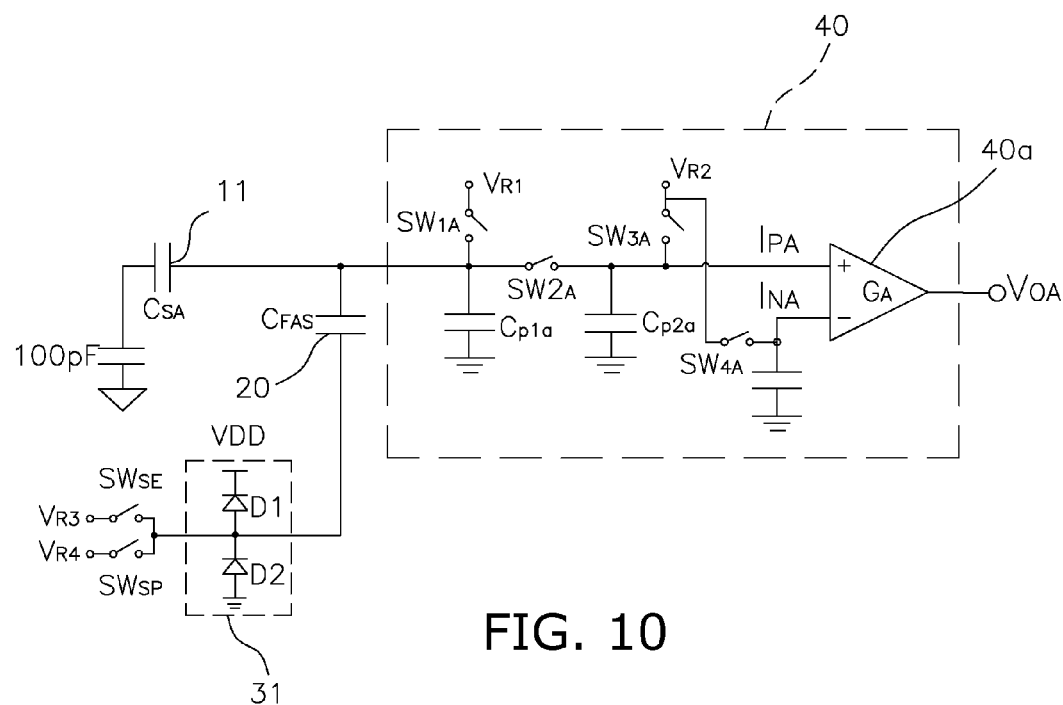
FIG. 10 is an equivalent circuit diagram of the circuit in FIG. 2.

With reference to FIG. 2, each ESD protection circuit 31 further has a driving circuit 32 to eliminate the parasitic capacitance $C_{FAS}$ between the ESD protection electrode 20 and the sensing electrodes 11. With further reference to FIG. 10, a detecting circuit 40 is coupled to one of the sensing electrodes 11 to be detected. The detecting circuit 40 has multiple switches including a first switch $SW_{1A}$, a second switch $SW_{2A}$, a third switch $SW_{3A}$ and a fourth switch $SW_{4A}$ and a differential circuit 40a. The differential circuit 40a has a non-inverting input (+) coupled to the sensing electrode 11 to be detected. The first switch $SW_{1A}$ is connected between a first voltage $V_{R1}$ and the sensing electrode 11. The second switch $SW_{2A}$ is connected between a second voltage $V_{R2}$ and the non-inverting input (+). The third switch $SW_{3A}$ is connected between the sensing electrode 11 and the non-inverting input (+). The fourth switch $SW_{4A}$ is connected between the second voltage $V_{R2}$ and an inverting input (−) of the differential circuit 40a. A capacitor is coupled between the inverting input (−) and a ground. The ESD protection electrode 20 is connected to an ESD protection circuit 31. A fifth switch $SW_{SE}$ is connected between a third voltage $V_{R3}$ and the ESD protection circuit 31. A sixth switch $SW_{SP}$ is connected between a fourth voltage $V_{R4}$ and the ESD protection circuit 31.

In a first phase, the first switch $SW_{1A}$, the third switch $SW_{3A}$, the fourth switch $SW_{4A}$ and the fifth switch $SW_{SE}$ are turned on and the second switch $SW_{2A}$ and the sixth switch $SW_{SP}$ are turned off. The first voltage $V_{R1}$ is supplied to the sensing electrode 11 to be detected. The non-inverting input (+) is connected to the second voltage $V_{R2}$. The driving circuit 32 supplies the third voltage $V_{R3}$ to the ESD protection electrode 20. The sensing electrode 11 to be detected is not connected to the differential circuit 40a. The first voltage $V_{R1}$ minus the second voltage $V_{R2}$ leaves a non zero difference.

In a second phase, the first switch $SW_{1A}$, the third switch $SW_{3A}$, the fourth switch $SW_{4A}$ and the fifth switch $SW_{SE}$ are turned off and the second switch $SW_{2A}$ and the sixth switch $SW_{SP}$ are turned on. The driving circuit 32 supplies the fourth voltage $V_{R4}$ to the ESD protection electrode 20. The sensing electrode 11 to be detected is not connected to the first voltage $V_{R1}$ and the non-inverting input (+) of the differential circuit 40a is not connected to the second voltage $V_{R2}$. The non-inverting input (+) of the differential circuit 40a is connected to the sensing electrode 11 to be detected, so as to read out the sensing signal from the sensing electrode 11 to be detected. The third voltage $V_{R3}$ minus the fourth voltage $V_{R4}$ leaves a non zero difference. In one embodiment, the difference of the third voltage $V_{R3}$ minus the fourth voltage $V_{R4}$ is equal to the difference of the first voltage $V_{R1}$ minus the second voltage $V_{R2}$ ($V_{R3}-V_{R4}=V_{R1}-V_{R2}$). In one embodiment, the first voltage $V_{R1}$ is equal to the third voltage $V_{R3}$, and second voltage $V_{R2}$ is equal to the fourth voltage $V_{R4}$.

Figure 11:
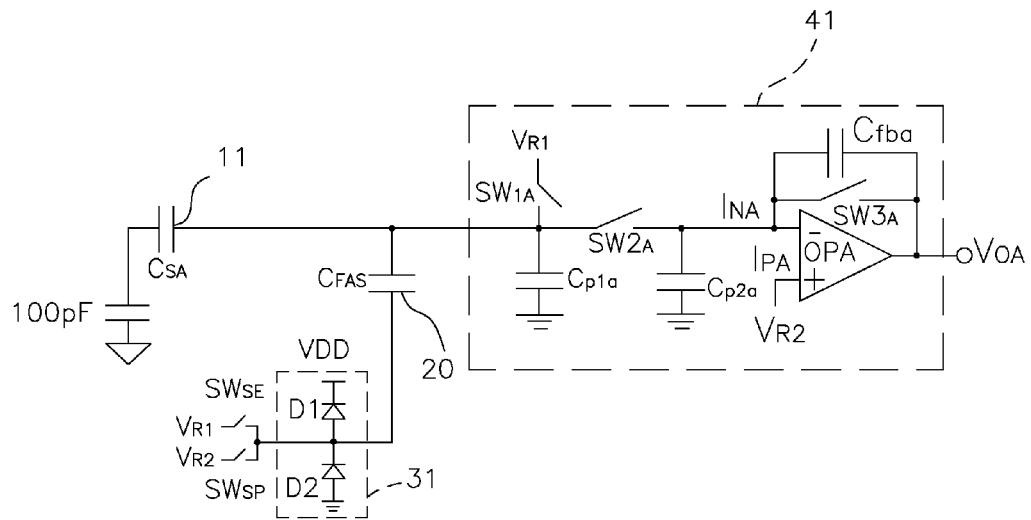
FIG. 11 is another equivalent circuit diagram of the circuit in FIG. 2.
Figure 12:
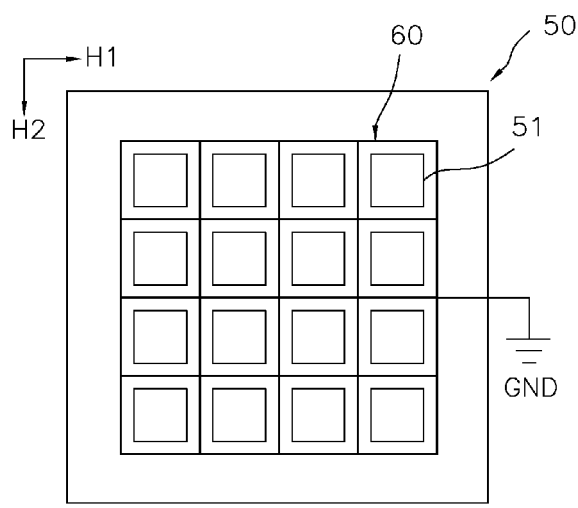
FIG. 12 is a top view of a conventional fingerprint sensor in accordance with the prior art.

With reference to FIGS. 2 and 11, in one embodiment, the sensing circuit 41 has an operational amplifier OPA, a sensing capacitor $C_{fba}$, a first switch $SW_{1A}$, a second switch $SW_{2A}$ and a third switch $SW_{3A}$. An inverting input (−) of the operational amplifier OPA is coupled to a sensing electrode 11 to be detected. The sensing capacitor $C_{fba}$ is coupled between the inverting input (−) of the operational amplifier OPA and an output $V_{OA}$. The first switch $SW_{1A}$ is connected between a first voltage $V_{R1}$ and the sensing electrode 11. The second switch $SW_{2A}$ is connected between the sensing electrode 11 and the inverting input (−) of the operational amplifier OPA. The third switch $SW_{3A}$ is connected to the sensing capacitor $C_{fba}$ in parallel. A second voltage V is connected to a non-inverting input (+) of the operational amplifier OPA. The capacitances $C_{p1a}$ and $C_{p2a}$ are represented as parasitic capacitances. The ESD protection electrode 20 is connected to an ESD protection circuit 31. A fifth switch $SW_{SE}$ is connected between a first voltage $V_{R1}$ and the ESD protection circuit 31. A sixth switch $SW_{SP}$ is connected between a second voltage V and the ESD protection circuit 31.

In the first phase, the first switch $SW_{1A}$, the third switch $SW_{3A}$ and the fifth switch $SW_{SE}$ are turned on and the second switch $SW_{2A}$ and the sixth switch $SW_{SP}$ are turned off. The first voltage $V_{R1}$ is supplied to the sensing electrode 11 to be detected and to the ESD protection electrode 20. The sensing electrode 11 to be detected is not connected to the operational amplifier OPA.

In the second phase, the first switch $SW_{1A}$, the third switch $SW_{3A}$ and the fifth switch $SW_{SE}$ are turned off and the second switch $SW_{2A}$ and the sixth switch $SW_{SP}$ are turned on. The second voltage V is supplied to the ESD protection electrode 20 and the non-inverting input (+) of the operational amplifier OPA. The inverting input (−) of the operational amplifier OPA is connected to the sensing electrode 11 to be detected, so as to read out the sensing signal of the sensing electrode 11 to be detected.

In conclusion, the ESD protection circuit in accordance with the present invention provides a first static electricity discharge path to the high electric potential terminal and a second static electricity discharge path to the low electric potential terminal. Therefore, the positive and negative static electricity charges of the ESD protection electrode are discharged through the first and second static electricity discharge paths to keep the fingerprint sensing array from damaging. Further, the ESD protection circuit in accordance with the present invention supplies different voltages to the ESD protection electrode in different phases Thus parasitic capacitance between the ESD protection electrode and the sensing electrodes is reduce.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A fingerprint sensor having electrostatic discharge (ESD) protection comprising:
    a body having a fingerprint sensing electrode array and an ESD protection electrode providing an ESD protection to the fingerprint sensing electrode array; and
    an ESD protection circuit connected to the ESD protection electrode, a high electric potential terminal and a low electric potential terminal, and comprising:
        a connecting end connected to the ESD protection electrode;
        a first discharging unit coupled between the high electric potential terminal and the connecting end to discharge a positive static electricity charge to the high electric potential terminal to provide a first static electricity discharge path to the high electric potential terminal; and
        a second discharging unit coupled between the low electric potential terminal and the connecting end to discharge a negative static electricity charge to the low electric potential terminal to provide a second static electricity discharge path to the low electric potential terminal.

2. The fingerprint sensor as claimed in claim 1, wherein the first discharging unit is a diode having
    an anode coupled to the connecting end; and
    a cathode coupled to the high electric potential terminal; and
the second discharging unit is a diode having
    an anode coupled to the low electric potential terminal; and
    a cathode coupled to the connecting end.

3. The fingerprint sensor as claimed in claim 1, wherein the first discharging unit is a P-type metal-oxide-semiconductor field-effect transistor having
    a drain coupled to the connecting end;
    a source coupled to the high electric potential terminal; and
    a gate coupled to the source; and
the second discharging unit is a N-type metal-oxide-semiconductor field-effect transistor having
    a drain coupled to the connecting end;
    a source coupled to the low electric potential terminal; and
    a gate coupled to the source of the N-type metal-oxide-semiconductor field-effect transistor.

4. The fingerprint sensor as claimed in claim 1, wherein the fingerprint sensing electrode array comprises m*n sensing electrodes arranged in m columns and n rows.

5. The fingerprint sensor as claimed in claim 4, wherein the ESD protection electrode comprises multiple first conductive lines arranged respectively on both sides of each column of the sensing electrodes.

6. The fingerprint sensor as claimed in claim 4, wherein the ESD protection electrode comprises multiple second conductive lines arranged respectively on both sides of each row of the sensing electrodes.

7. The fingerprint sensor as claimed in claim 5, wherein the ESD protection electrode comprises multiple second conductive lines arranged respectively on both sides of each row of the sensing electrodes.

8. The fingerprint sensor as claimed in claim 5 further comprising multiple ESD protection circuits, wherein a first end of each first conductive line is respectively connected to one of the ESD protection circuits.

9. The fingerprint sensor as claimed in claim 8 further comprising multiple ESD protection circuits, wherein a second end of each first conductive line is respectively connected to one of the ESD protection circuits.

10. The fingerprint sensor as claimed in claim 6 further comprising multiple ESD protection circuits, wherein a first end of each second conductive line is respectively connected to one of the ESD protection circuits.

11. The fingerprint sensor as claimed in claim 10 further comprising multiple ESD protection circuits, wherein a second end of each second conductive line is respectively connected to one of the ESD protection circuits.

12. The fingerprint sensor as claimed in claim 7 further comprising multiple ESD protection circuits, wherein a first end of each first conductive line is connected to one of the ESD protection circuits and a first end of each second conductive line is connected to one of the ESD protection circuits.

13. The fingerprint sensor as claimed in claim 7 further comprising multiple ESD protection circuits, wherein both ends of each first conductive line are respectively connected to one of the ESD protection circuits and a first end of each second conductive line is respectively connected to one of the ESD protection circuits.

14. The fingerprint sensor as claimed in claim 7 further comprising multiple ESD protection circuits, wherein both ends of each first conductive line are respectively connected to one of the ESD protection circuits and a first end of each second conductive line is respectively connected to one of the ESD protection circuits.

15. The fingerprint sensor as claimed in claim 5 further comprising multiple ESD protection circuits, wherein an outermost one of the first conductive lines or of the second conductive lines is connected to the multiple protection circuits.

16. The fingerprint sensor as claimed in claim 6 further comprising multiple ESD protection circuits, wherein an outermost one of the first conductive lines or of the second conductive lines is connected to the multiple protection circuits.

17. The fingerprint sensor as claimed in claim 1, wherein the fingerprint sensing electrode array and the ESD protection electrode are formed in the same layer of the body.

18. The fingerprint sensor as claimed in claim 1, wherein the body has
  a first layer; and
  a second layer formed above the first layer;
the fingerprint sensing electrode array is formed in the first layer of the body; and
the ESD protection electrode is formed in the second layer of the body.

19. The fingerprint sensor as claimed in claim 1, wherein the ESD protection electrode includes a first ESD protection electrode and a second ESD protection electrode connecting to each other;
the body has
  a first layer; and
  a second layer formed under the first layer;
the first ESD protection electrode is formed in the first layer of the body; and
the fingerprint sensing electrode array and the second ESD protection electrode are formed in the second layer of the body.

20. The fingerprint sensor as claimed in claim 1, wherein the ESD protection electrode includes a first ESD protection electrode and a second ESD protection electrode connecting to each other;
the body has
  a first layer; and
  a second layer formed above the first layer;
the first ESD protection electrode is formed in the first layer of the body; and
the fingerprint sensing electrode array and the second ESD protection electrode are formed in the second layer of the body.

21. The fingerprint sensor as claimed in claim 1, wherein the ESD protection electrode includes a first ESD protection electrode, a second ESD protection electrode and a third ESD protection electrode connecting to each other;
the body has a first layer, a second layer and a third layer formed between the first and second layers;
the first ESD protection electrode is formed in the first layer of the body; and
the fingerprint sensing electrode array and the second ESD protection electrode are formed in the second layer of the body; and
the third ESD protection electrode is formed in the third layer of the body.

22. The fingerprint sensor as claimed in claim 1 further comprising a protecting layer on the body having multiple holes formed through the protecting layer to connecting to the ESD protection electrode.

23. The fingerprint sensor as claimed in claim 4 further comprising a sensing circuit having a differential circuit, and the differential circuit having a non-inverting input coupled to one of the sensing electrodes to be detected, wherein
  in a first phase, a first voltage is supplied to the sensing electrode to be detected, the non-inverting input is connected to a second voltage, a third voltage is supplied to the ESD protection electrode, the sensing electrode to be detected is not connected to the differential circuit, and the first voltage minus the second voltage leaves a non zero difference; and
  in a second phase, a fourth voltage is supplied to the ESD protection electrode, the non-inverting input of the differential circuit is connected to the sensing electrode to be detected, and the third voltage minus the fourth voltage leaves a non zero difference.

24. The fingerprint sensor as claimed in claim 23, wherein the difference of the third voltage minus the fourth voltage is equal to the difference of the first voltage minus the second voltage.

25. The fingerprint sensor as claimed in claim 23, wherein the first voltage is equal to the third voltage and the second voltage is equal to the fourth voltage.

26. The fingerprint sensor as claimed in claim 4 further comprising a sensing circuit having an operational amplifier and a sensing capacitor, and the operational amplifier coupled to one of the sensing electrodes to be detected, and the sensing capacitor coupled between an inverting input and output of the operational amplifier, wherein
  in a first phase, a first voltage is supplied to the ESD protection electrode the sensing electrode to be detected, and the sensing electrode to be detected is not connected to the operational amplifier; and
  in a second phase, a second voltage is supplied to the ESD protection electrode and a non-inverting input of the operational amplifier, and the non-inverting input of the operational amplifier is connected to the sensing electrode to be detected.

* * * * *